United States Patent
Nam et al.

(10) Patent No.: US 7,139,064 B2
(45) Date of Patent: Nov. 21, 2006

(54) OPTICAL SYSTEM FOR PROVIDING A HEXAPOLE ILLUMINATION AND METHOD OF FORMING A PHOTORESIST PATTERN ON A SUBSTRATE USING THE SAME

(75) Inventors: Dong-Seok Nam, Seoul (KR); Chan Hwang, Seoul (KR); Young-Seog Kang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 197 days.

(21) Appl. No.: 10/867,469

(22) Filed: Jun. 14, 2004

(65) Prior Publication Data
US 2005/0105072 A1 May 19, 2005

(30) Foreign Application Priority Data
Jun. 23, 2003 (KR) .................. 10-2003-0040873

(51) Int. Cl.
G03B 27/54 (2006.01)
G03B 27/42 (2006.01)
G03B 27/52 (2006.01)

(52) U.S. Cl. ............................. 355/67; 355/53; 355/55

(58) Field of Classification Search ............... 355/53, 355/67, 55, 77
See application file for complete search history.

(56) References Cited

U.S. PATENT DOCUMENTS

2004/0174512 A1* 9/2004 Toyoda et al. ............... 355/67
2004/0207829 A1* 10/2004 Hansen et al. ............... 355/67

FOREIGN PATENT DOCUMENTS

KR 000025202 A 5/2000

* cited by examiner

*Primary Examiner*—Peter B. Kim
(74) *Attorney, Agent, or Firm*—F. Chau & Associates, LLC

(57) ABSTRACT

In an optical system for forming a photoresist pattern on a substrate, an optical element such as a holographic optical element and an aperture plate provides an off-axis illumination beam having a hexapole. The photoresist pattern is formed to form structures such as contact pads, and includes first holes and second holes repeatedly arranged on the substrate. The hexapole includes four first poles symmetrically disposed with respect to an x-axis and a y-axis, and two second poles disposed in the x-axis so as to be symmetric with respect to the y-axis. The off-axis illumination beam may improve a resolution of the photoresist pattern and a depth of focus (DOF) of a light beam to be projected onto the substrate.

20 Claims, 17 Drawing Sheets

OPTICAL SYSTEM FOR PROVIDING A HEXAPOLE ILLUMINATION AND METHOD OF FORMING A PHOTORESIST PATTERN ON A SUBSTRATE USING THE SAME

BACKGROUND OF THE INVENTION

1. Field of the Invention

The present invention relates to an exposure apparatus for forming a photoresist pattern on a semiconductor substrate. More particularly, the present invention relates to an optical system of an exposure apparatus for forming a photoresist pattern on a silicon wafer used as a semiconductor substrate.

2. Description of the Related Art

Semiconductor devices may be manufactured by a process including a fabrication process performed for forming electronic circuits on a silicon wafer used as a semiconductor substrate, an electrical die sorting (EDS) process performed for inspecting electrical characteristics of the semiconductor devices on the semiconductor substrate, and a packaging process performed for packaging the semiconductor devices in epoxy resins and individuating the semiconductor devices.

The fabrication process may include various unit processes such as a deposition process, a chemical mechanical polishing (CMP) process, a photolithography process, an etching process, an ion implantation process, a cleaning process, an inspection process, or other similar processes. The unit processes may be repeatedly performed to form the semiconductor devices of the semiconductor substrate.

The photolithography process may be performed to form the photoresist pattern on a layer formed on the semiconductor substrate to form the layer into a specific pattern having electrical characteristics. The photoresist pattern is used as a mask in an etching process for forming the specific pattern.

The photolithography process may include a photoresist coating process for coating the semiconductor substrate with a photoresist composition, a soft baking process for forming the coated photoresist composition on the wafer into a photoresist layer, an exposure process and a development process for forming the photoresist layer into a photoresist pattern using a photo mask or a reticle, a hard baking process for hardening the photoresist pattern on the wafer, or the like.

Patterns on semiconductor substrates have gradually decreased in size, having finer features, as an integration degree of semiconductor devices has increased. Accordingly, a resolution and a depth of focus (DOF) in the photolithography process have become more important.

The resolution and the DOF may be influenced by a wavelength of a light beam and a numerical aperture (NA) of a projection lens used in the photolithography process. Examples of the light beam used in the photolithography process may include a g-line light beam having a wavelength of 436 nm, an i-line light beam having a wavelength of 365 nm, a KrF laser beam having a wavelength of 248 nm, an ArF laser beam having a wavelength of 198 nm, a $F_2$ laser beam having a wavelength of 157 nm, or the like.

Methods for preventing distortion of the photoresist pattern, for example, due to scattering and diffraction of the light beam transmitted through the photo mask in accordance with shrinkage of the patterns, may include using a phase shift mask (PSM) or an optical proximity correction (OPC) method.

Where a numerical aperture of the projection lens is increased to improve the resolution the DOF may deteriorate. An off-axis illumination (OAI) may be used to improve the DOF by projecting a zero-order diffracted light beam and positive first-order diffracted light beam occurring from the photo mask onto the semiconductor substrate.

Examples of the OAI may include an annular illumination (AI), a dipole illumination, quadrupole illumination, or the like. For example, U.S. Pat. No. 5,447,810 to Chen et al. discloses masks for improved lithographic patterning for off-axis illumination lithography, and U.S. Pat. No. 6,388,736 to Smith et al. discloses an imaging method using phase boundary masking with modified illumination.

FIG. 1 is a cross-sectional view illustrating an example of a light beam used in the annular illumination, and FIGS. 2 and 3 are plan views showing photoresist patterns formed using the light beam as shown in FIG. 1. FIG. 4 is a cross-sectional view illustrating another example of the light beam used in the annular illumination, and FIGS. 5 and 6 are plan views showing photoresist patterns formed using the light beam as shown in FIG. 4.

Referring to FIGS. 1 to 6, a ratio of an inside diameter and an outside diameter of an annular illumination beam 10a in FIG. 1 to a diameter of an equivalent circle 12 of a projection lens is about 0.65:0.85:1. A ratio of an inside diameter and an outside diameter of an annular illumination beam 10b in FIG. 4 to a diameter of an equivalent circle 12 of a projection lens is about 0.58:0.88:1.

Photoresist patterns 22a, 22b, 24a and 24b correspond to contact pads to be formed on a semiconductor substrate 20 in FIGS. 2, 3, 5 and 6.

FIGS. 2 and 3 show the photoresist pattern 22a and 22b formed on the semiconductor substrate 20 using the annular illumination beam 10a as shown in FIG. 1. FIG. 2 shows the photoresist pattern 22a formed on the semiconductor substrate 20 when a light beam transmitted through a photo mask is focused onto a surface of a photoresist layer on the semiconductor substrate 20. FIG. 3 shows the photoresist pattern 22b formed on the semiconductor substrate 20 when a light beam transmitted through the photo mask is focused at a point spaced by about 0.3 µm upwardly apart from the surface of the photoresist layer on the semiconductor substrate 20.

FIGS. 5 and 6 show the photoresist patterns 24a and 24b formed on the semiconductor substrate 20 using the annular illumination beam 10b as shown in FIG. 4. FIG. 5 shows the photoresist pattern 24a formed on the semiconductor substrate 20 when a light beam transmitted through the photo mask is focused onto the surface of the photoresist layer on the semiconductor substrate 20. FIG. 6 shows the photoresist pattern 24b formed on the semiconductor substrate 20 when a light beam transmitted through the photo mask is focused at a point spaced by about 0.3 µm upwardly apart from the surface of the photoresist layer on the semiconductor substrate 20.

As shown in figures, the resolution of the photoresist pattern and the DOF of the light beam may be determined in accordance with a cross-sectional shape of the light beam and a distance between the projection and the semiconductor substrate. Thus, the OAI may not cope effectively with complex and/or fine photoresist patterns, and a process margin in the photolithography process may not be sufficiently secured. Consequently, there is a need for improving the resolution and the DOF in a photolithographic process.

SUMMARY OF THE INVENTION

An optical system includes a hexapole illumination apparatus capable of substantially securing a process margin in a photolithography process for forming a photoresist pattern to be used in subsequent processes for forming structures such as contact pads on a substrate.

A method according to an embodiment of the present disclosure forms a photoresist pattern on a substrate using a hexapole illumination to substantially secure a process margin in a photolithography process.

According to one embodiment of the present disclosure, an optical system includes a light source for generating a first light beam, an optical element for forming the first light beam into an off-axis illumination beam having a hexapole, an illumination lens for directing the off-axis illumination beam onto a photo mask having a mask pattern, and a projection lens for receiving a second light beam transmitted through the photo mask and projecting the second light beam onto a substrate so as to form a photoresist pattern corresponding to the mask pattern on the substrate.

According to another embodiment of the present disclosure, a method for forming a photoresist pattern on a substrate includes generating a first light beam, forming the first light beam into an off-axis illumination beam having a hexapole, directing the off-axis illumination beam onto a photo mask having a mask pattern so as to forming a second light beam transmitted through the photo mask, and projecting the second light beam onto a substrate so as to form a photoresist pattern corresponding to the mask pattern on the substrate.

The photoresist pattern may include a plurality of first holes arranged in rows and columns and a plurality of second holes arranged in a zigzag along a row direction and a column direction. Each second hole is arranged at a center of an imaginary rectangle limited by four first holes, and has a cross-sectional area greater than those of the first holes.

The hexapole of the off-axis illumination beam incident upon the illumination lens includes four first poles and two second poles.

The first poles have a first size, and are symmetrically disposed with respect to an x-axis and a y-axis substantially perpendicularly intersecting each other. The x-axis and the y-axis are arranged on a plane that is substantially perpendicular with respect to an optical axis of the illumination lens. The x-axis and the y-axis are arranged on a plane that is substantially perpendicular to an advancing direction of the off-axis illumination beam.

The second poles have a second size equal to or greater than the first size, and are disposed in the x-axis so as to be symmetric with respect to the y-axis. Preferably, a ratio of the first size to the second size may be from about 1:1 to about 1:5.

A first distance $\sigma_1$ between each first pole and the y-axis, a second distance $\sigma_2$ between each first pole and the x-axis, and a third distance $\sigma_3$ between each second pole and the y-axis may be expressed by the following equations, respectively:

$\sigma_1 = \lambda/(2p_1 NA),$ $\sigma_2 = \lambda/(2p_2 NA),$ and $\sigma_3 = \lambda/(p_1 NA),$ where $\lambda$ indicates a wavelength of the first light beam, $p_1$ indicates a first pitch of the first holes arranged in a row direction, $p_2$ represents a second pitch of the second holes arranged in a column direction, and NA represents a numerical aperture of the projection lens.

A resolution of the photoresist pattern including the first holes and the second holes and a depth of focus of the second light beam may be improved by means of the off-axis illumination beam having the hexapole as above-mentioned.

BRIEF DESCRIPTION OF THE DRAWINGS

The present invention will become more apparent by describing in detail exemplary embodiments thereof with reference to the attached drawings in which.

DETAILED DESCRIPTION OF PREFERRED EMBODIMENTS

The present invention now will be described more fully hereinafter with reference to the accompanying drawings in which preferred embodiments of the disclosure are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
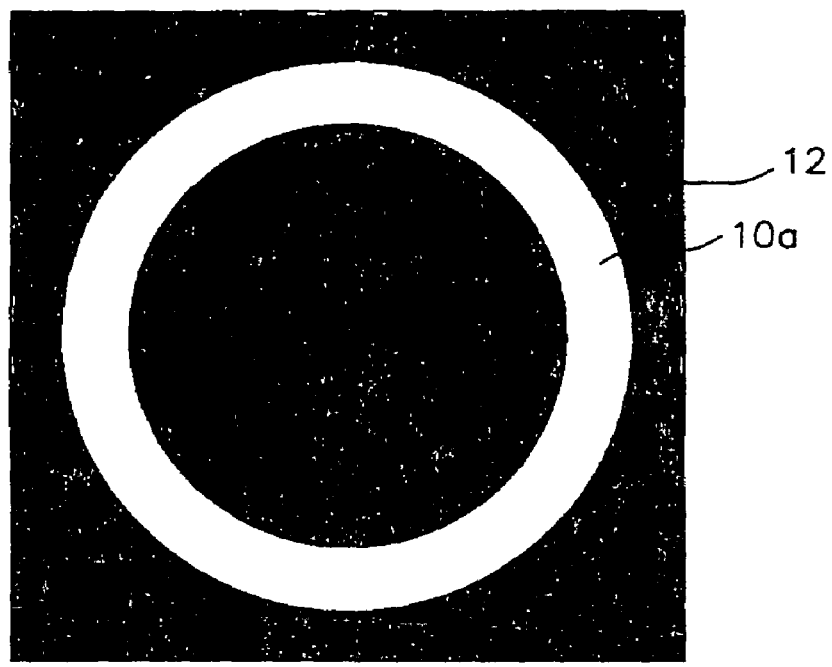
FIG. 1 is a cross-sectional view illustrating an example of a light beam used in an annular illumination according to the prior art.
Figure 2:
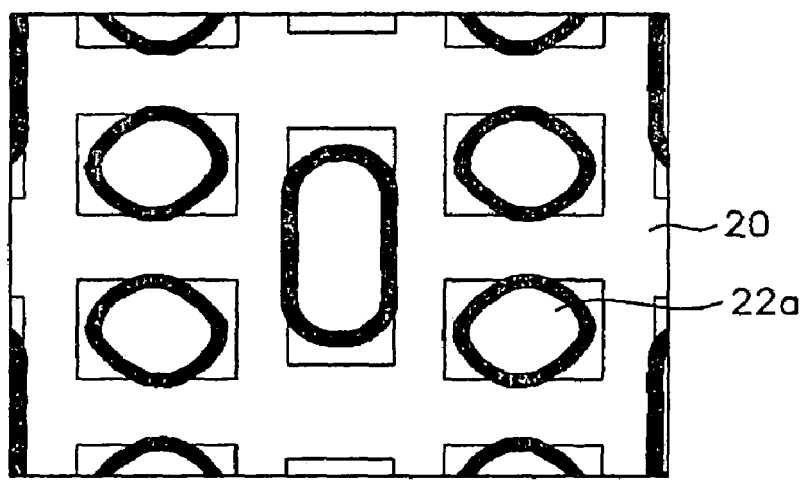
FIGS. 2 and 3 are plan views showing photoresist patterns formed using the light beam as shown in FIG. 1.
Figure 3:
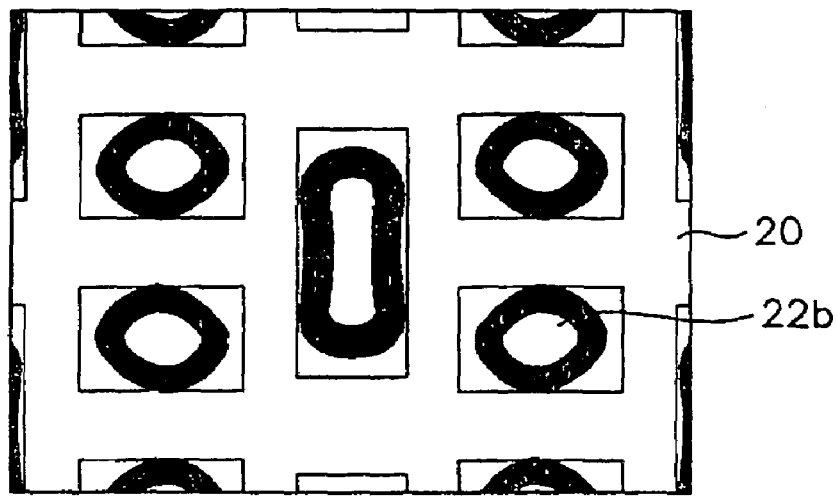
Figure 4:
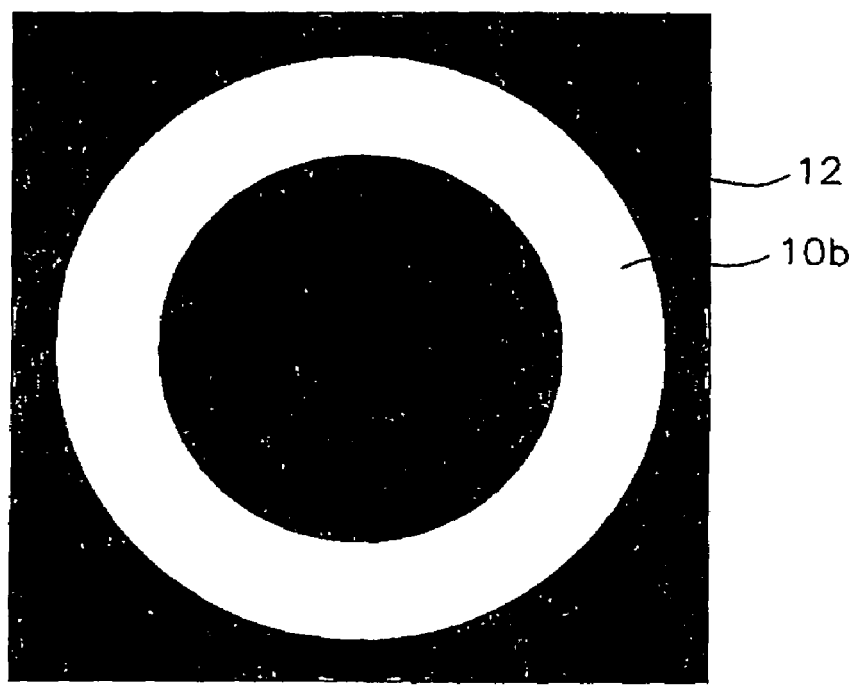
FIG. 4 is a cross-sectional view illustrating another example of the light beam used in the annular illumination according to the prior art.
Figure 5:
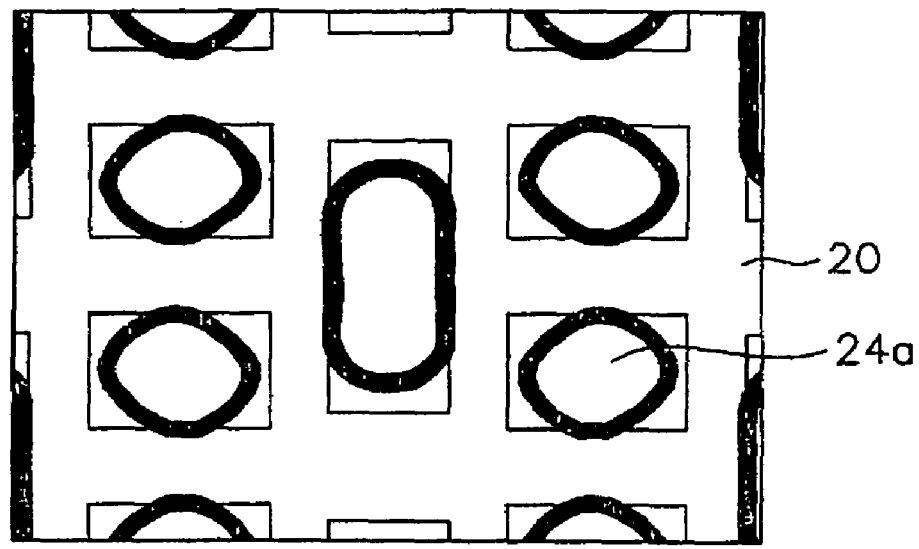
FIGS. 5 and 6 are plan views showing photoresist patterns formed using the light beam as shown in FIG. 4.
Figure 6:
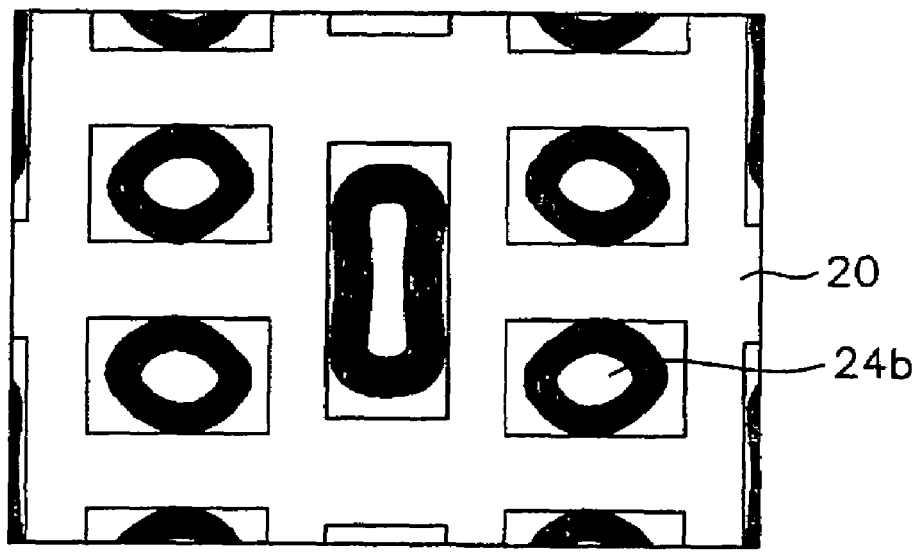
Figure 7:
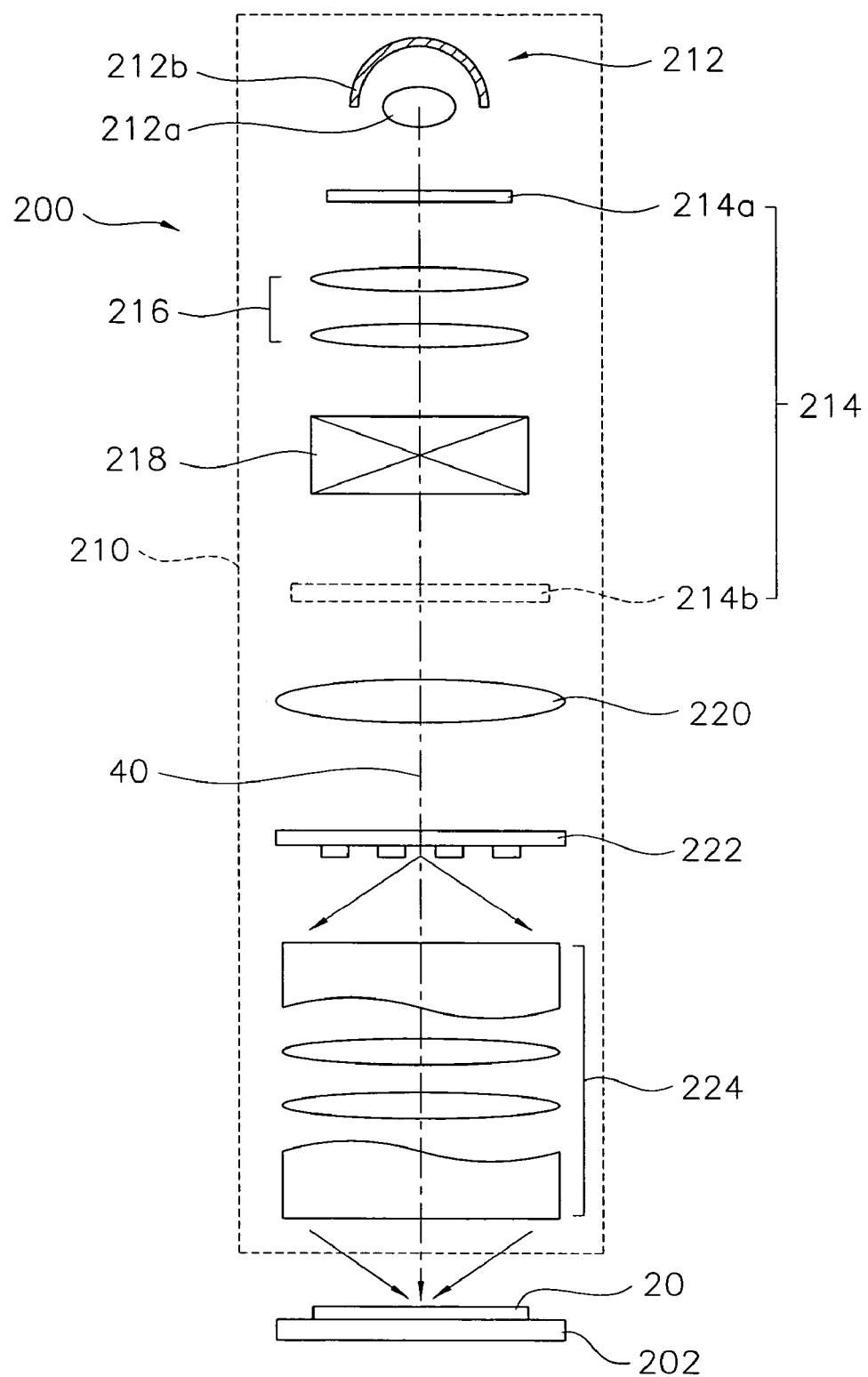
FIG. 7 is a schematic view of an optical system according to an embodiment of the present disclosure.
Figure 8:
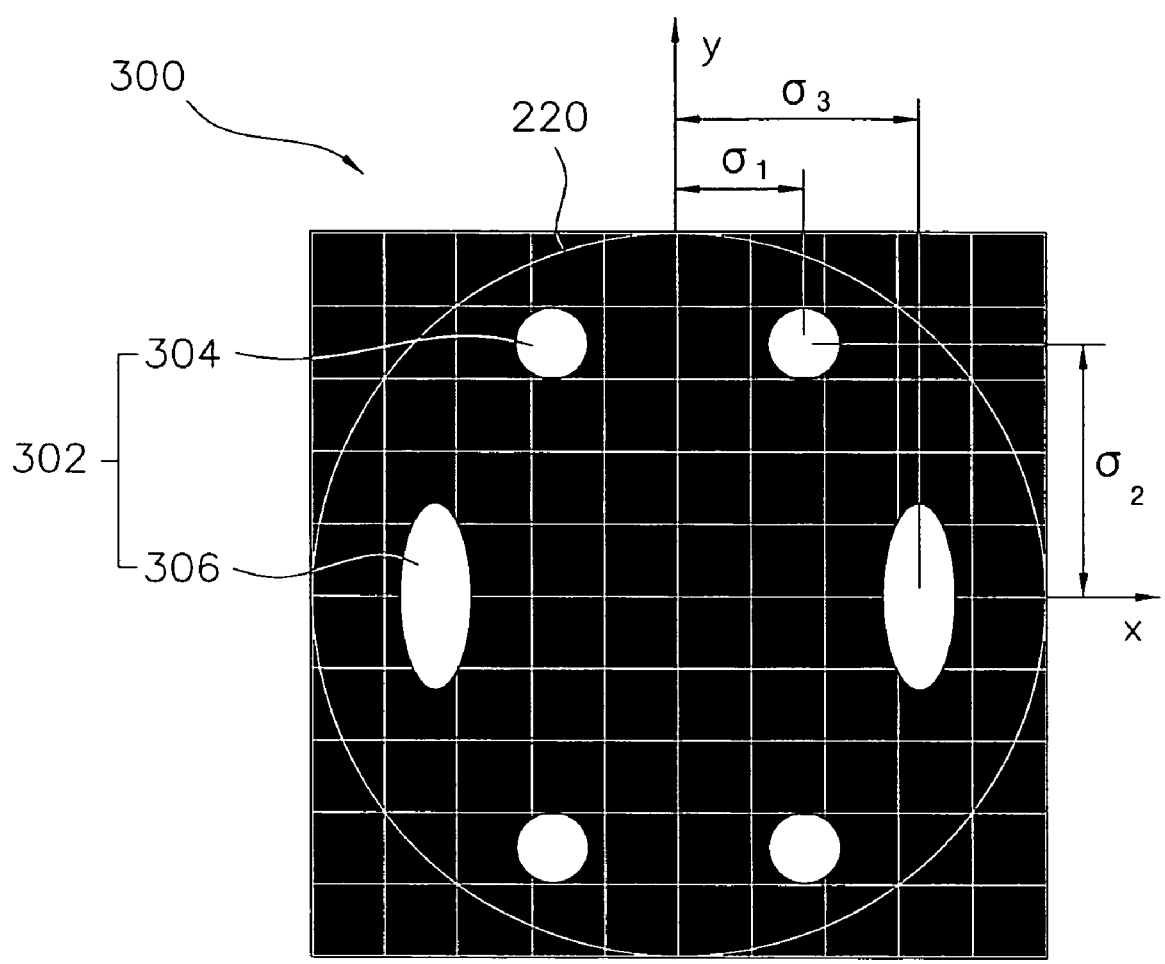
FIG. 8 is a cross-sectional view of an off-axis illumination beam having a hexapole according to an embodiment of the present disclosure.
Figure 9:
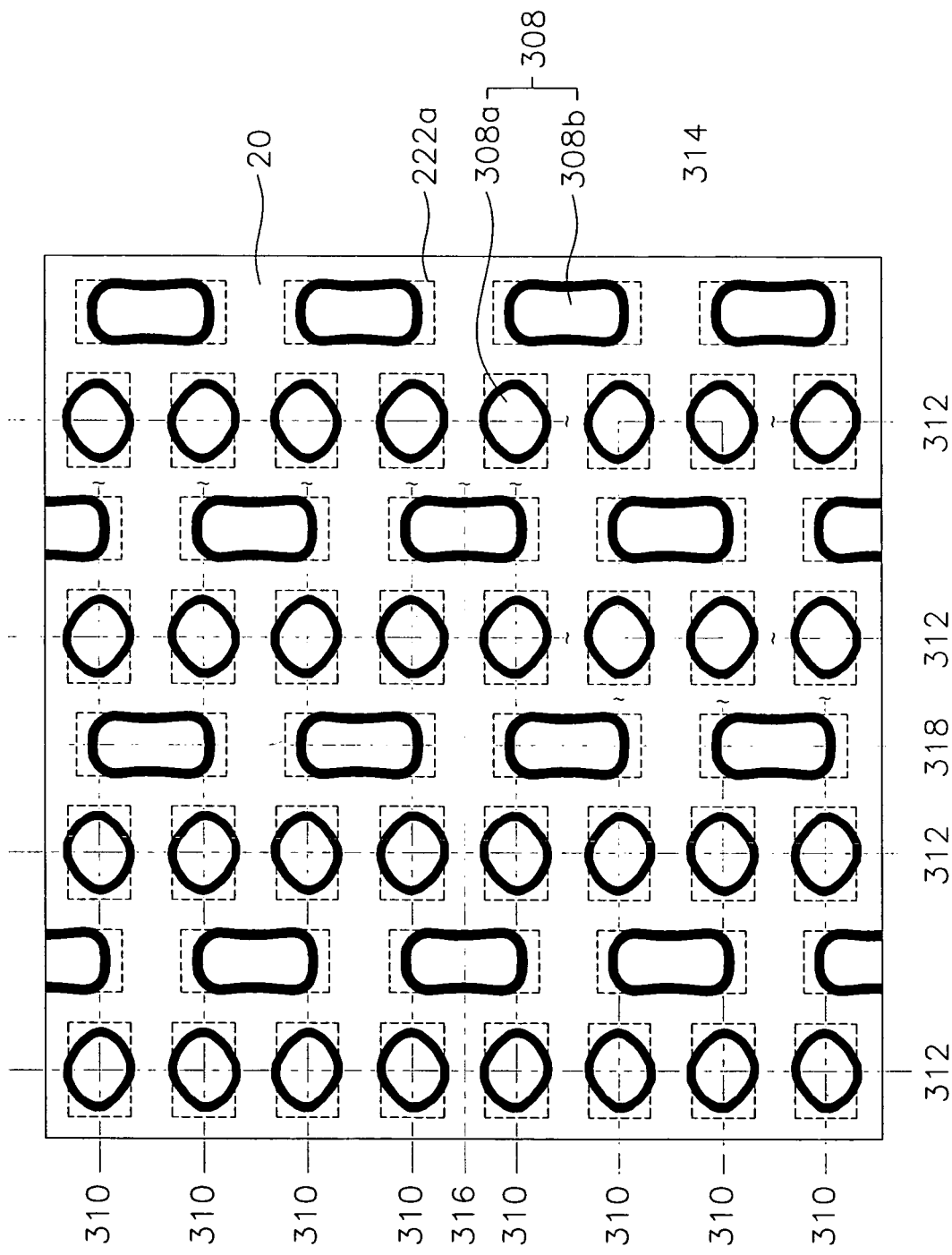
FIG. 9 is a plan view showing a photoresist pattern formed using the off-axis illumination beam as shown in FIG. 8.

FIG. 7 is a schematic view of an optical system according to an embodiment of the present disclosure, FIG. 8 is a cross-sectional view of an off-axis illumination beam having a hexapole, and FIG. 9 is a plan view showing a photoresist pattern formed using the off-axis illumination beam as shown in FIG. 8.

Referring to FIGS. 7 to 9, an exposure apparatus 200 for forming a photoresist pattern on a semiconductor substrate 20 includes an optical system 210 for irradiating a light beam onto a photoresist layer formed on the semiconductor substrate 20, and a stage 202 for supporting and moving the semiconductor substrate 20.

The optical system 210 includes a light source 212, an optical element 214, a condenser lens unit 216, a fly's eye microlens array 218, an illumination lens 220, a photo mask 222, and a projection lens 224.

The light source 212 may include a mercury lamp 212a and a hemispherical mirror 212b. A light beam may include a g-line light beam having a wavelength of 436 nm, an i-line light beam having a wavelength of 365 nm, or the like.

The optical element 214 is employed for forming a first light beam generated from the light source 212 into an off-axis illumination beam having a hexapole. Examples of the optical element 214 may include a holographic optical element 214a (HOE), an aperture plate 214b having a plurality of openings, or the like.

When the holographic optical element 214a is used as the optical element 214, the holographic optical element 214a may be disposed between the light source 212 and the condenser lens unit 216. When the aperture plate 214b is used as the optical element 214, the aperture plate 214b may be disposed between the fly's eye microlens array 218 and the illumination lens 220. While the aperture plate 214b is shown disposed between the fly's eye microlens array 218 and the illumination lens 220 in FIG. 7, the aperture plate 214b may be disposed between the light source 212 and the condenser lens unit 216 or between the condenser lens unit 216 and the fly's eye microlens array 218. The holographic element 214a may increase an intensity of the off-axis illumination beam as compared with the aperture plate 214b. The aperture plate 214b may allow the optical system 210 to be configured into relatively simple construction.

The off-axis illumination beam is directed onto the illumination lens 220 through the condenser lens unit 216 and the fly's eye microlens array 218. The illumination lens 220 directs the off-axis illumination beam onto the photo mask 222. The projection lens 224 projects a second light beam, received through the photo mask 222, onto the photoresist layer on the semiconductor substrate 20.

An optical axis 40 of the illumination lens 220 is substantially identical to an advancing direction of the off-axis illumination beam and an optical axis of the projection lens 224.

The hexapole 302 of the off-axis illumination beam 300 incident upon the illumination lens 220 includes four first poles 304 and two second poles 306. The first poles 304 are preferably symmetrically disposed with respect to an x-axis and a y-axis, which are substantially perpendicular and intersect each other. The second poles 306 are preferably disposed in the x-axis so as to be symmetric with respect to the y-axis. The x-axis and the y-axis are arranged on an illuminated plane that is substantially perpendicular to the optical axis 40 of the illumination lens 220. The x-axis and the y-axis are arranged on a plane that is substantially perpendicular to the advancing direction of the off-axis illumination beam 300.

Further, the first poles 304 have a first size, and the second poles 306 have a second size equal to or greater than the first size. The first poles 304 may be provided in a form of a circle, and the second poles 306 may be provided in a form of an ellipse extending along the y-axis direction.

When the holographic optical element 214a is used as the optical element 214, the first light beam is converted into the off-axis illumination beam 300 having the hexapole 302 by the holographic optical element 214a as shown in FIG. 8. When the aperture plate 214b is used as the optical element 214, the aperture plate 214b has the plurality of openings corresponding to the hexapole 302 as shown in FIG. 8.

A photoresist pattern 308 formed on the semiconductor substrate 20 may include a repeated pattern corresponding to structures, such as contact pads for a metal wiring, to be formed on the semiconductor substrate 20. The photo mask 222 has a mask pattern 222a corresponding to the photoresist pattern 308.

Further, the photoresist pattern 308 includes a plurality of first holes 308a arranged in rows 310 and columns 312, and a plurality of second holes 308b arranged in a zigzag along a row direction and a column direction. Each second hole 308b is arranged at a center of an imaginary rectangle limited by four first holes 308a, and has a cross-sectional area greater than those of the first holes 308a. Here, the x-axis is substantially parallel to the rows 310, and the y-axis is substantially parallel to the columns 312.

The photoresist pattern 308 has a symmetrical configuration with respect to a first imaginary line and a second imaginary line, which are substantially perpendicular and intersect each other at a center of an arbitrary second hole 308b, and the first and second imaginary lines are substantially parallel to the rows 310 and the columns 312, respectively.

Figure 10:
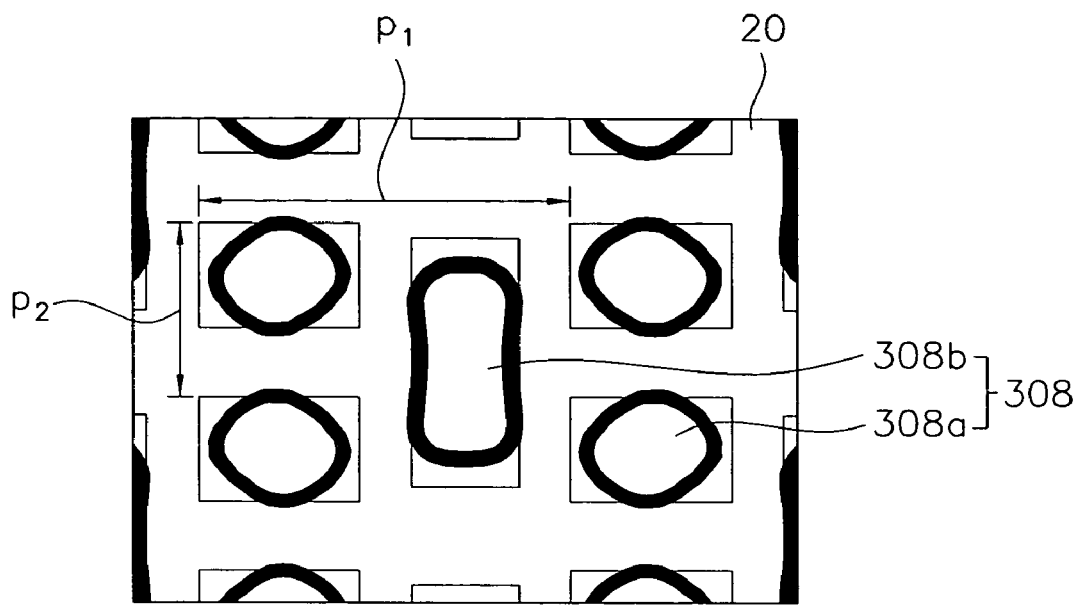
FIGS. 10 and 11 are enlarged plan views illustrating the photoresist pattern formed using the off-axis illumination beam as shown in FIG. 8.
Figure 11:
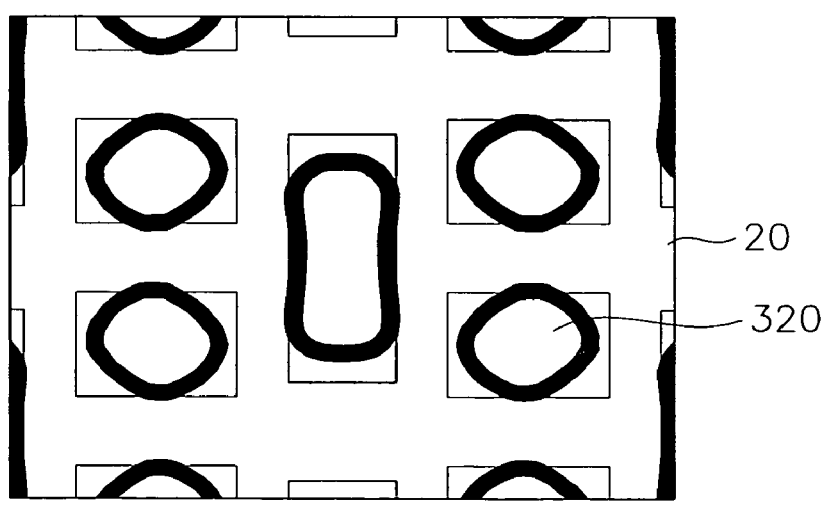

FIGS. 10 and 11 are enlarged plan views illustrating the photoresist pattern formed using the off-axis illumination beam as shown in FIG. 8.

Referring to FIG. 10, the photoresist pattern 308 is formed on the semiconductor substrate 20 when the second light beam transmitted through the photo mask 222 is focused onto the surface of the photoresist layer on the semiconductor substrate 20. In FIG. 11, a photoresist pattern 320 is formed on the semiconductor substrate 20 when the second light beam transmitted through the photo mask 222 is focused at a point spaced by about 0.3 μm upwardly apart from the surface of the photoresist layer on the semiconductor substrate 20.

The photoresist patterns 308 and 320 as shown in FIGS. 10 and 11 have resolutions relatively improved compared to the photoresist patterns as shown in FIGS. 2, 3, 5 and 6.

Consequently, the off-axis illumination beam 300 having the hexapole 302 may improve the resolution of the photoresist pattern and the depth of focus of the second light beam.

Positions of the first poles 304 and the second poles 306 of the off-axis illumination beam 300 as shown in FIG. 8 may be determined by pitches of the first holes 308a as shown in FIG. 10. The positions of the first poles 304 and the second poles 306 may be determined by the following equations:

$$\sigma_1 = \lambda/(2\, p_1\, NA),$$

$$\sigma_2 = \lambda/(2\, p_2\, NA), \text{ and}$$

$$\sigma_3 = \lambda/(p_1\, NA),$$

where $\sigma_1$ is a first distance between each first pole 304 and the y-axis, $\sigma_2$ is a second distance between each first pole 304 and the x-axis, and $\sigma_3$ is a third distance between each second pole 306 and the y-axis, $\lambda$ is a wavelength of the first light beam, $p_1$ is a first pitch of the first holes 308a arranged in the row direction, $p_2$ is a second pitch of the second holes 308a arranged in a column direction, and NA is a numerical aperture of the projection lens 224.

Figure 12:
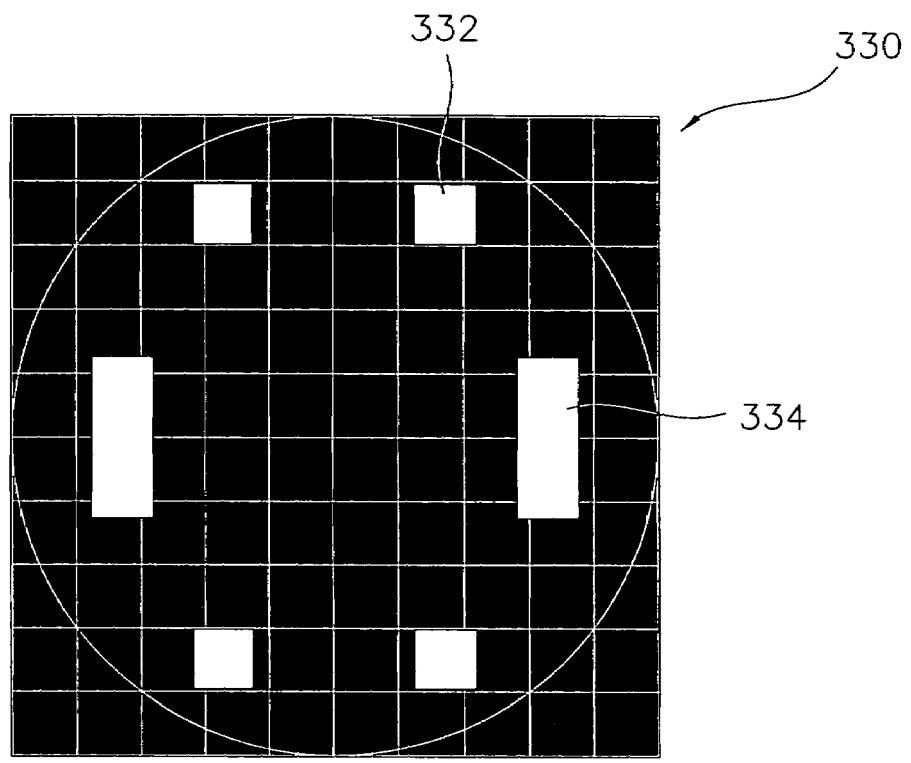
FIG. 12 is a cross-sectional view showing another example of an off-axis illumination beam having a hexapole according to an embodiment of the present disclosure.
Figure 13:
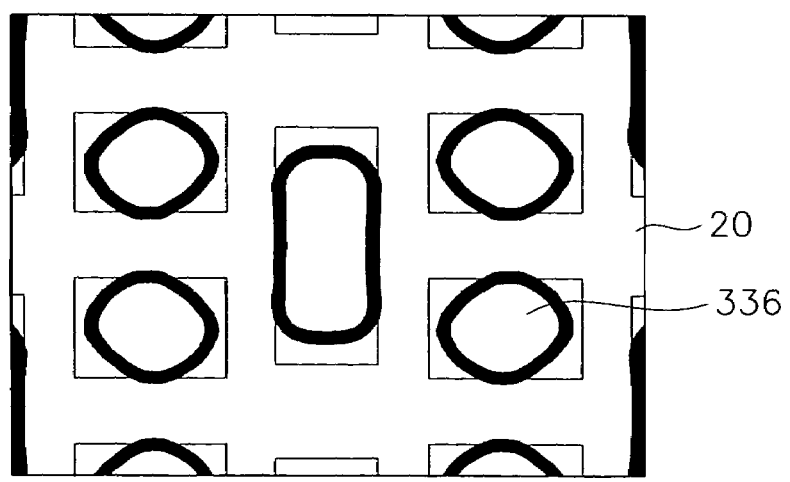
FIGS. 13 and 14 are plan views showing photoresist patterns formed using the off-axis illumination beam as shown in FIG. 12.
Figure 14:
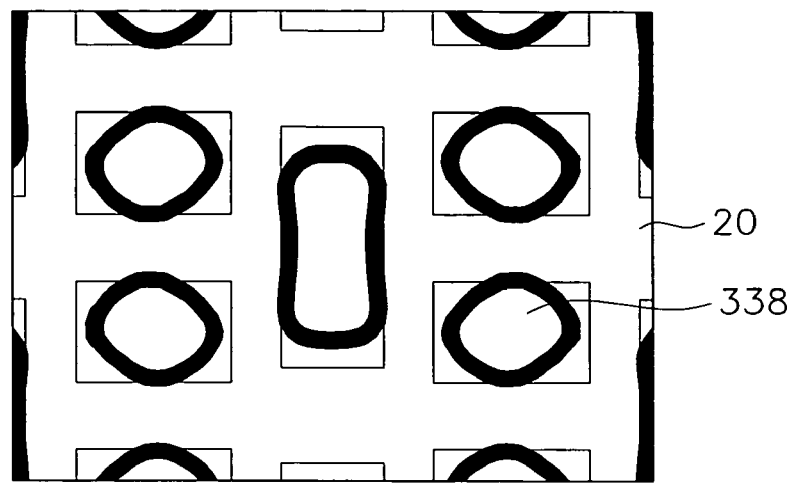

FIG. 12 is a cross-sectional view showing another example of an off-axis illumination beam 330 having a hexapole, and FIGS. 13 and 14 are plan views showing photoresist patterns formed using the off-axis illumination beam 330 as shown in FIG. 12.

Figure 15:
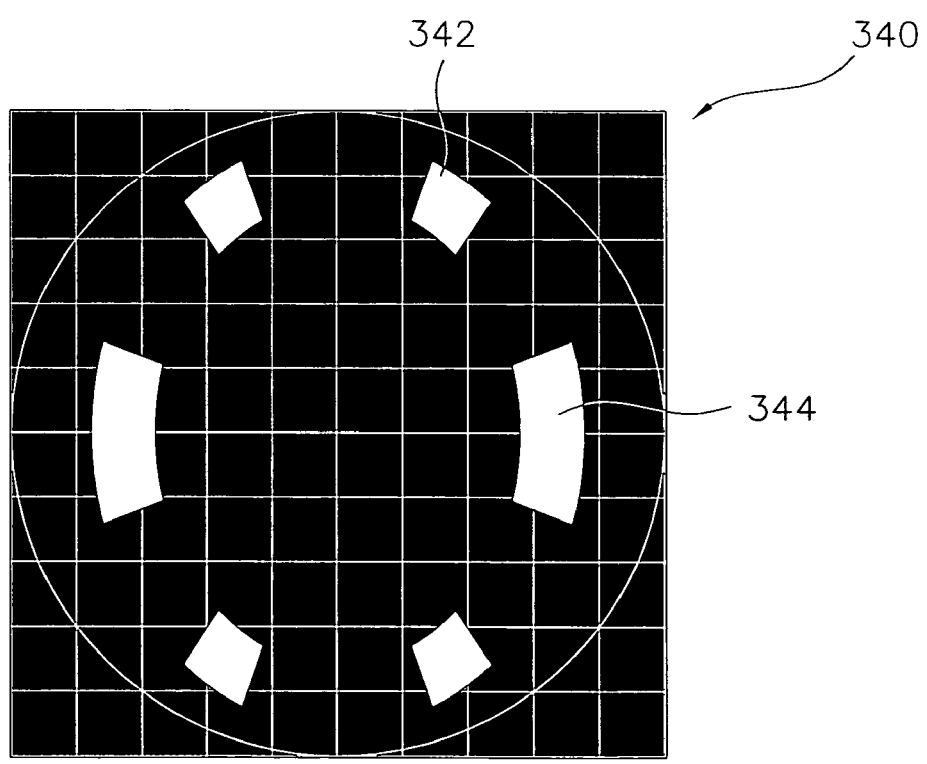
FIG. 15 is a cross-sectional view showing still another example of an off-axis illumination beam having a hexapole according to an embodiment of the present disclosure.
Figure 16:
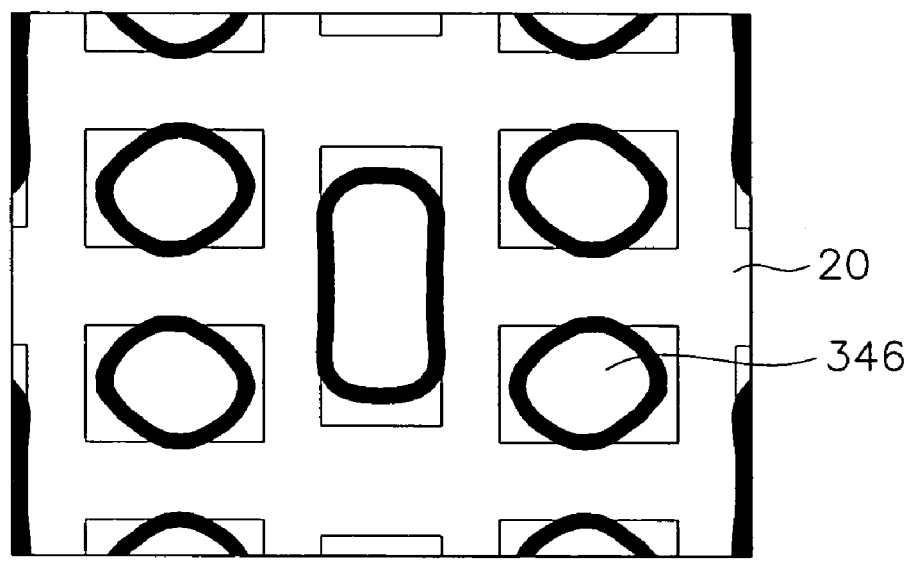
FIGS. 16 and 17 are plan views showing photoresist patterns formed using the off-axis illumination beam as shown in FIG. 15.
Figure 17:
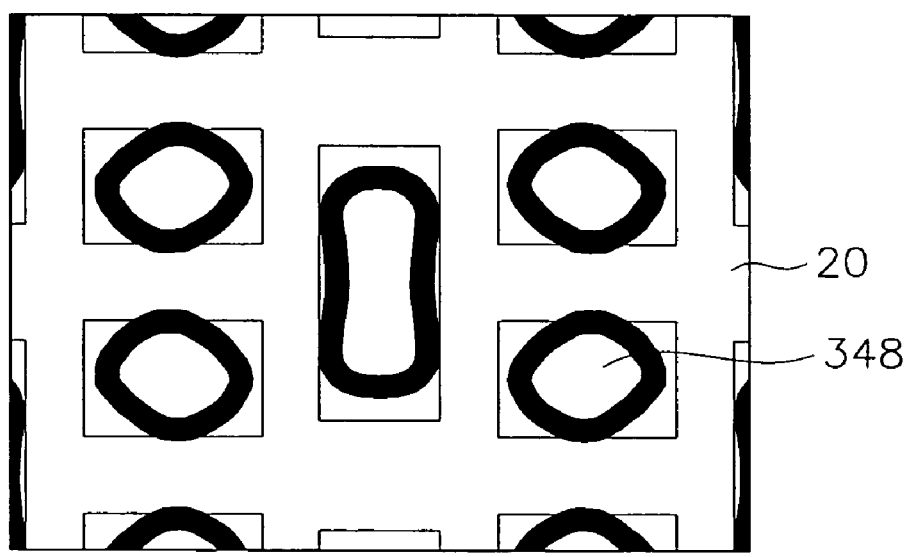

FIG. 15 is a cross-sectional view showing still another example of an off-axis illumination beam 340 having a hexapole, and FIGS. 16 and 17 are plan views showing photoresist patterns formed using the off-axis illumination beam 340 as shown in FIG. 15.

Figure 18:
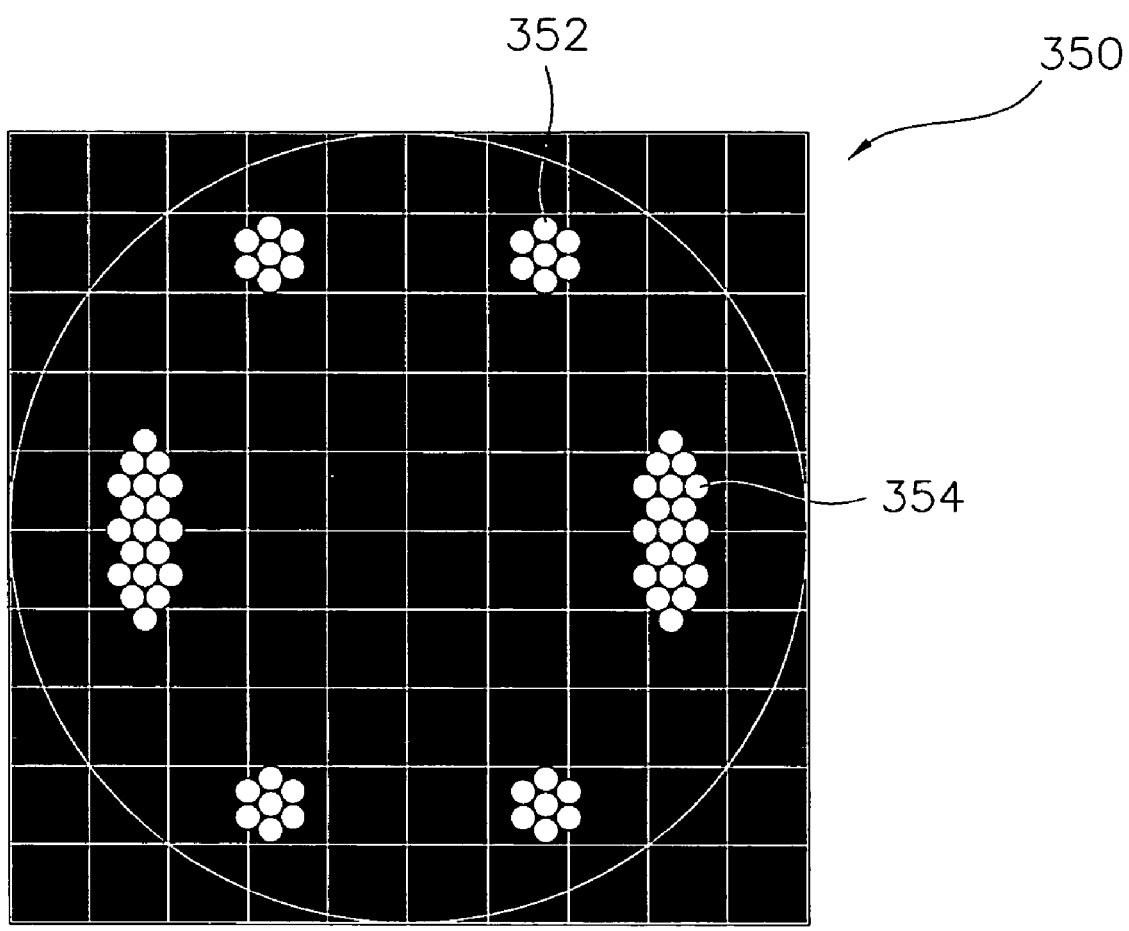
FIG. 18 is a cross-sectional view showing still another example of an off-axis illumination beam having a hexapole according to an embodiment of the present disclosure.

FIG. 18 is a cross-sectional view showing still another example of an off-axis illumination beam 350 having a hexapole.

Referring to FIG. 12, each first pole 332 of an off-axis illumination beam 330 may be provided in a form of a regular tetragon, and each second pole 334 may be provided in a form of a right-angled tetragon extending in a y-axis direction (refer to FIG. 8).

Referring to FIG. 15, first poles 342 and second poles 344 of an off-axis illumination beam 340 may be provided in a form of sectors arranged centering on an optical axis of an illumination lens (refer to FIGS. 7 and 8). Each second pole 344 has a relatively long circumferential length with respect to each first pole 342.

FIGS. 13 and 16 show photoresist patterns 336 and 346 formed on the semiconductor substrate 20 when second light beams formed using the off-axis illumination beams 330 and 340 are focused onto the surface of the photoresist layer on the semiconductor substrate 20, respectively.

FIGS. 14 and 17 show photoresist patterns 338 and 348 formed on the semiconductor substrate 20 when the second light beams formed using the off-axis illumination beams 330 and 340 are focused at the point spaced by about 0.3 μm upwardly apart from the surface of the photoresist layer on the semiconductor substrate 20, respectively.

The photoresist patterns 336, 338, 346 and 348 as shown in FIGS. 13, 14, 16 and 17, respectively, have relatively improved resolutions compared to the photoresist patterns 22a, 22b, 24a and 24b as shown in FIGS. 2, 3, 5 and 6. Consequently, the off-axis illumination beams 330 and 340 may improve the resolution of the photoresist pattern and the depth of focus of the second light beam. Further, the present invention is not limited to forms of the first poles and second poles mentioned above.

As shown in figures, even though the first poles of the hexapole are provided in the form of the circle, the regular tetragon or the sector, the first poles may be provided in a form of, for example, an ellipse or an elongated right-angled tetragon. Further, the second poles of the hexapole are provided in the form of the ellipse or the elongated right-angled tetragon. Alternatively, the second poles may be provided in a form of, for example, a circle or a regular tetragon.

Furthermore, first poles 352 and second poles 354 of an off-axis illumination beam 350 may include a plurality of third poles as shown in FIG. 18. Each third pole has a third size smaller than a first size of each first pole 352, and may be provided in a form of, for example, a circle.

Figure 19:
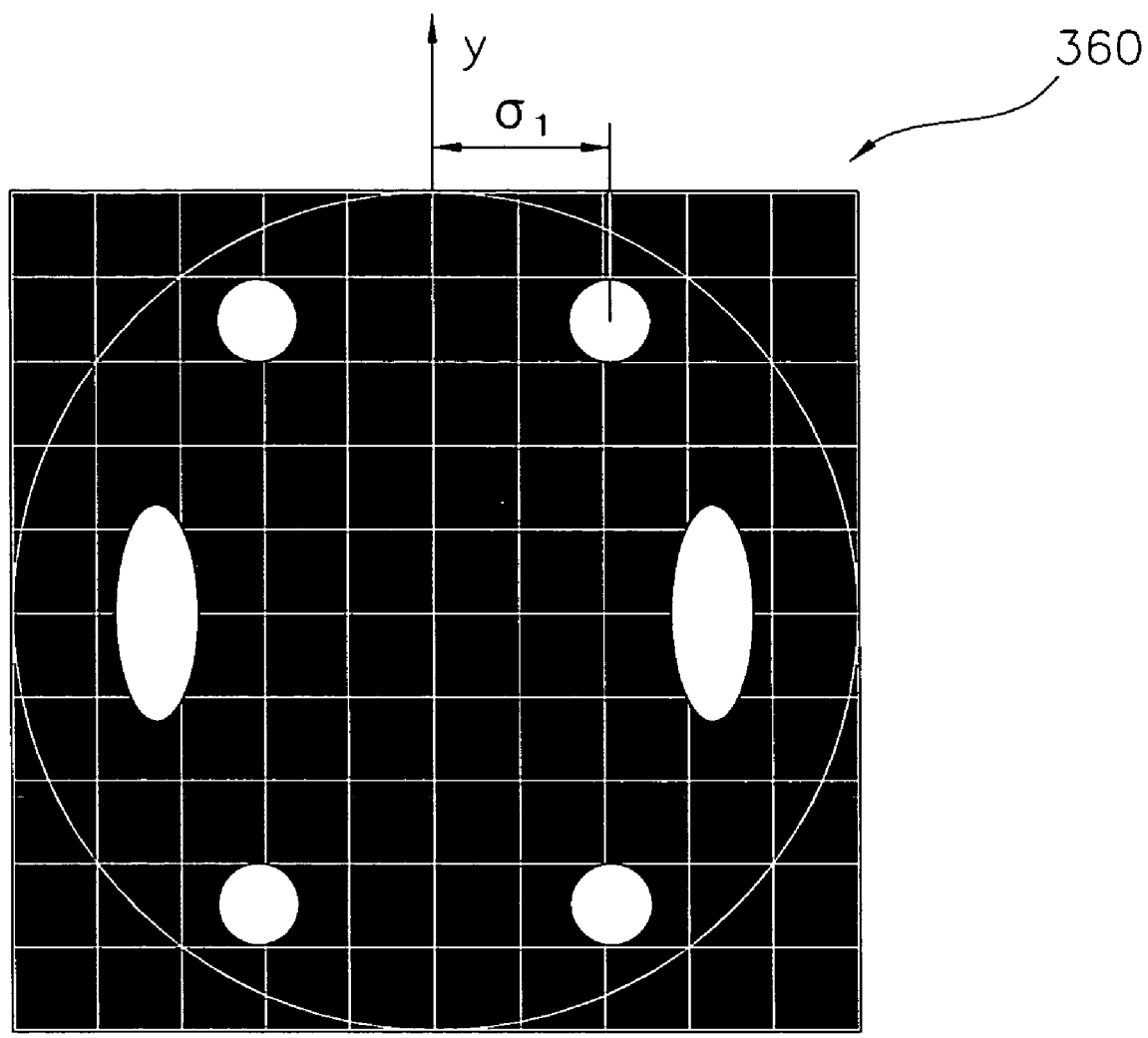
FIG. 19 is a cross-sectional view showing still another example of an off-axis illumination beam having a hexapole according to an embodiment of the present disclosure.
Figure 20:
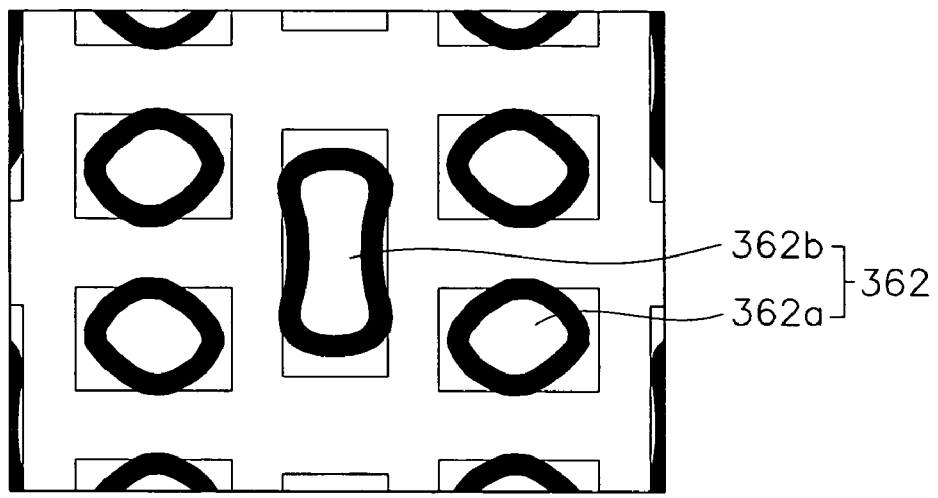
FIG. 20 is a plan view showing a photoresist pattern formed using the off-axis illumination beam as shown in FIG. 19.

FIG. 19 is a cross-sectional view showing still another example of an off-axis illumination beam 360 having a hexapole, and FIG. 20 is a plan view showing a photoresist pattern formed using the off-axis illumination beam 360 as shown in FIG. 19.

Referring to FIG. 19, a first distance $\sigma_1$ of an off-axis illumination beam 360 is longer than the first distance $\sigma_1$ of the off-axis illumination beam 300 shown in FIG. 8.

Referring to FIG. 20, first holes 362a of a photoresist pattern 362 are approximately similar to the first holes 308a shown in FIG. 10. Second holes 362b are varied as compared with the second holes 308b shown in FIG. 10. However, resolution of the photoresist pattern 362 shown in FIG. 20 is within an allowable tolerance range. Thus, it is noted that the first distance $\sigma_1$ the second distance $\sigma_2$, and the third distance 3 have a tolerance range of about ±10%.

Figure 21:
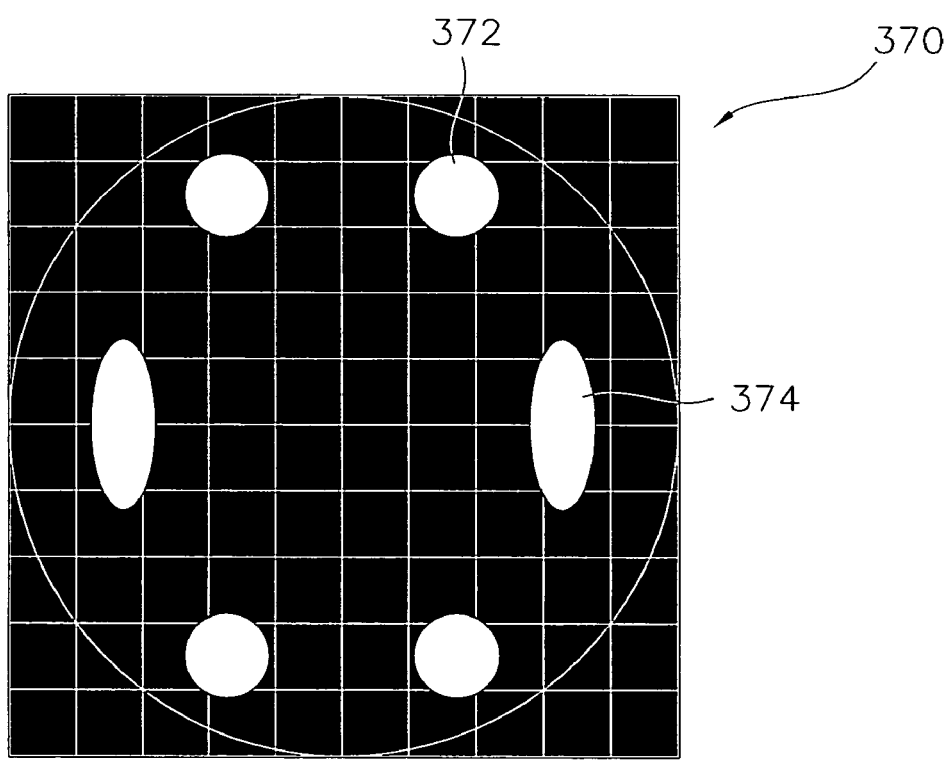
FIG. 21 is a cross-sectional view showing still another example of an off-axis illumination beam having a hexapole according to an embodiment of the present disclosure.
Figure 22:
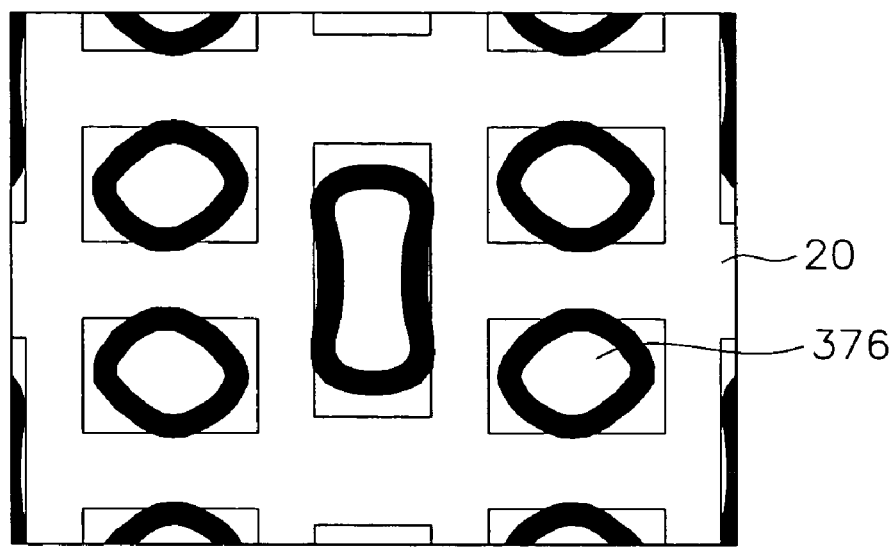
FIG. 22 is a plan view showing a photoresist pattern formed using the off-axis illumination beam as shown in FIG. 21.

FIG. 21 is a cross-sectional view showing still another example of an off-axis illumination beam 370 having a hexapole, and FIG. 22 is a plan view showing a photoresist pattern formed using the off-axis illumination beam 370 as shown in FIG. 21.

Referring to FIG. 21, a first size of each first pole 372 of an off-axis illumination beam 370 is greater than the first size of each first pole 304 of the off-axis illumination beam 300 shown in FIG. 8.

Referring to FIG. 22, a photoresist pattern 376 is approximately similar to the photoresist pattern 308 shown in FIG. 10. Consequently, it is noted that a ratio of the first size of the first pole 372 to the second size of the second pole 374 may be determined in a range of from about 1:1 to about 1:5. The second size of the second pole 374 may be varied in accordance with a cross-sectional area of the second hole of the photoresist pattern.

Thought not shown in figures, resolution of the photoresist pattern may be improved by adjusting a ratio between a first intensity of the first pole and a second intensity of the second pole in a range of from about 1:1 to about 1:5 when the first size and the second size are substantially identical to each other. Further, the resolution of the photoresist pattern may be improved by adjusting the ratio between the first intensity and the second intensity even when the first size is smaller than the second size.

Figure 23:
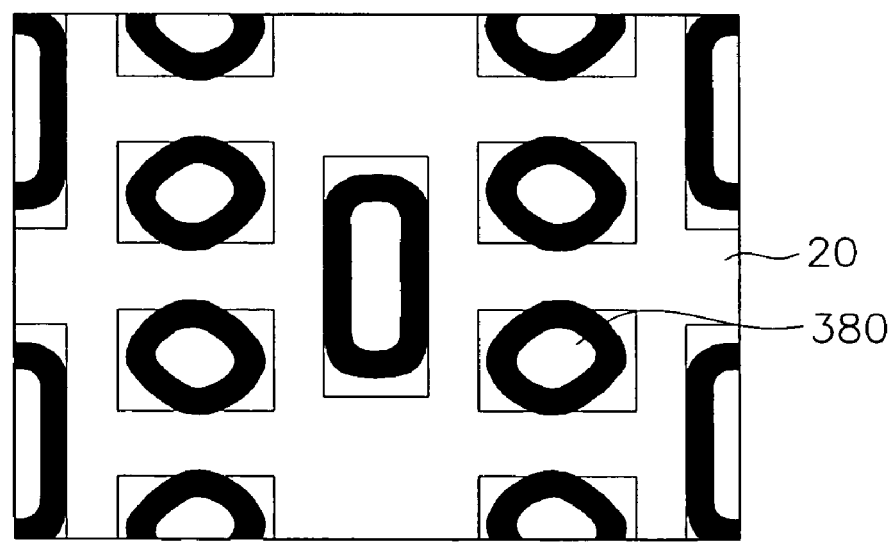
FIG. 23 is a plan view showing a photoresist pattern formed using the off-axis illumination beam as shown in FIG. 8, and having a size of 89% of the photoresist pattern as shown in FIG. 10.
Figure 24:
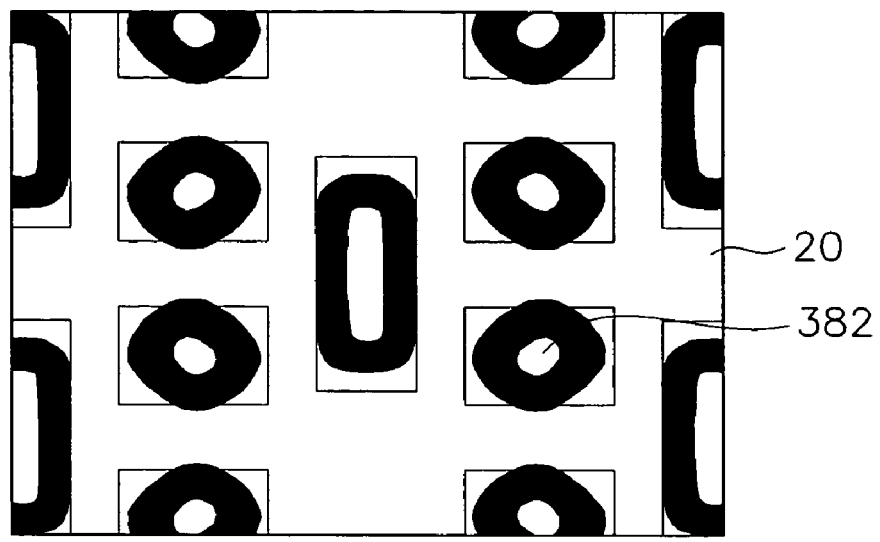
FIG. 24 is a plan view showing a photoresist pattern formed using the off-axis illumination beam as shown in FIG. 8, and having a size of 87% of the photoresist pattern as shown in FIG. 10.

FIG. 23 is a plan view showing a photoresist pattern formed using the off-axis illumination beam 300 as shown in FIG. 8, and having a size of 89% of the photoresist pattern as shown in FIG. 10. FIG. 24 is a plan view showing a photoresist pattern formed using the off-axis illumination beam 300 as shown in FIG. 8, and having a size of 87% of the photoresist pattern as shown in FIG. 10

Referring to FIGS. 10, 23 and 24, the off-axis illumination beam 300 shown in FIG. 8 may be sufficiently employed to form a photoresist pattern 380 having a size of 89% of the photoresist pattern 308 shown in FIG. 10. However, the off-axis illumination beam 300 shown in FIG. 8 may be unsuitable to be used for forming a photoresist pattern 382 having a size of 87% of the photoresist pattern 308 shown in FIG. 10.

The off-axis illumination beam 300 may be employed to form a photoresist pattern having a size of from about 90% to about 110% of the photoresist pattern 308. An off-axis illumination beam having a hexapole suitably configured in accordance with a specific photoresist pattern having a predetermined size may be employed to form a photoresist pattern having a size of from about 90% to about 110% of the predetermined specific photoresist pattern.

Figure 25:
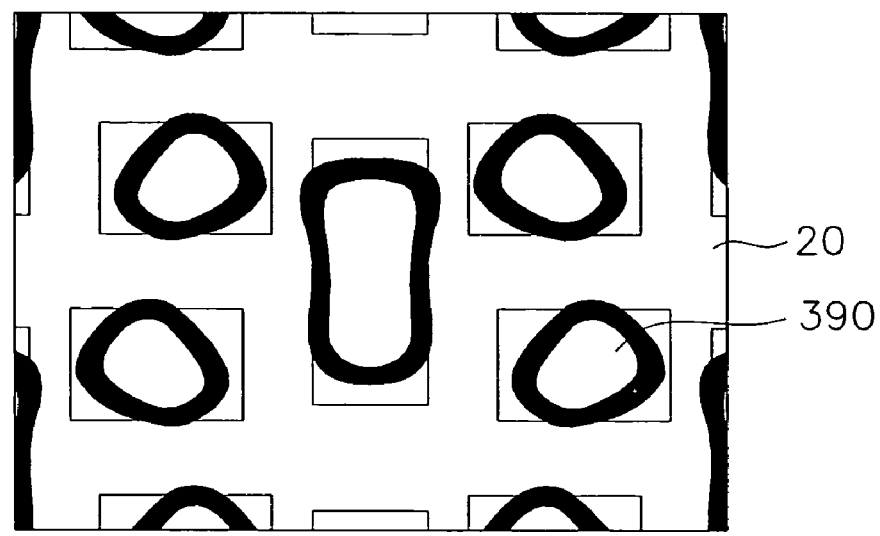
FIGS. 25 and 26 are plan views showing further examples of the photoresist pattern formed using the off-axis illumination beam as shown in FIG. 8.
Figure 26:
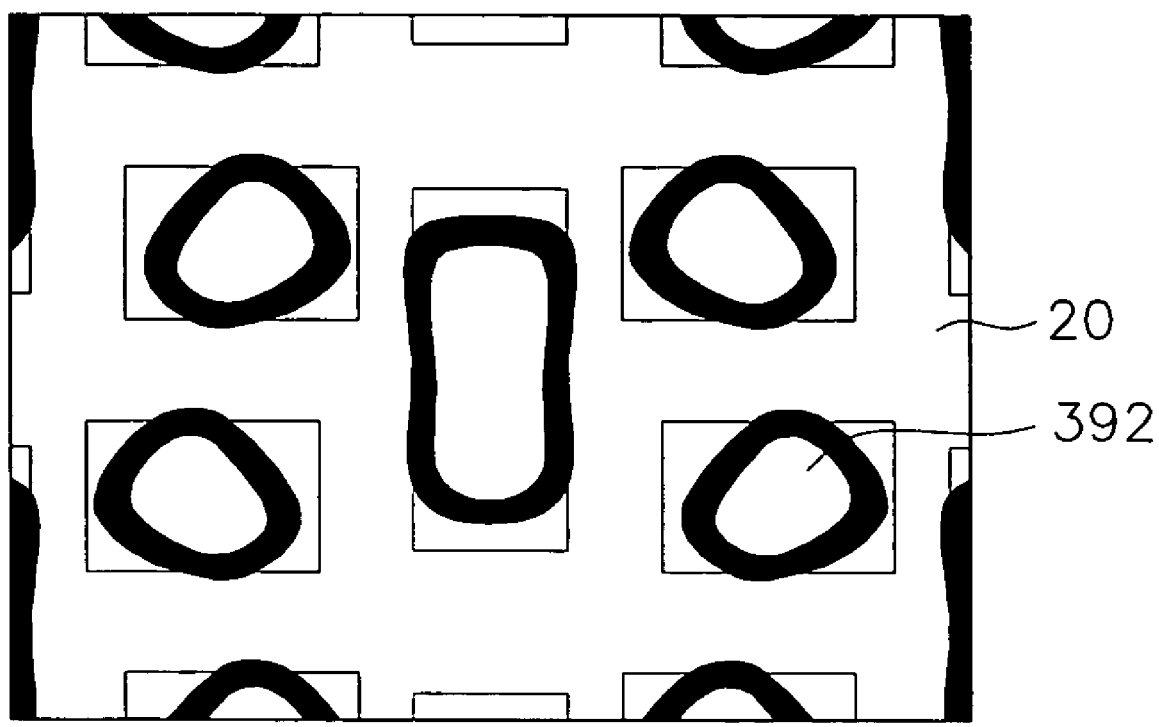

FIGS. 25 and 26 are plan views showing further examples of the photoresist pattern formed using the off-axis illumination beam as shown in FIG. 8.

Referring to FIGS. 25 and 26, photoresist patterns 390 and 392 have shapes varied as compared with the photoresist pattern 308 shown in FIG. 10.

The photoresist pattern 390 may be formed when a second light beam formed using the off-axis illumination beam 300 shown in FIG. 8 is focused onto the surface of the photoresist layer on the semiconductor substrate. The photoresist pattern 392 may be formed when a second light beam formed using the off-axis illumination beam 300 shown in FIG. 8 is focused at the point spaced by about 0.3 µm upwardly apart from the surface of the photoresist layer on the semiconductor substrate.

As shown in figures, the off-axis illumination beam 300 shown in FIG. 8 may be effectively employed to form the photoresist patterns 390 and 392. Further, it is noted that the off-axis illumination beam 300 may be effectively employed together with a photo mask that is formed by an optical proximity correction (OPC) method having a serif or a scattering bar.

Figure 27:
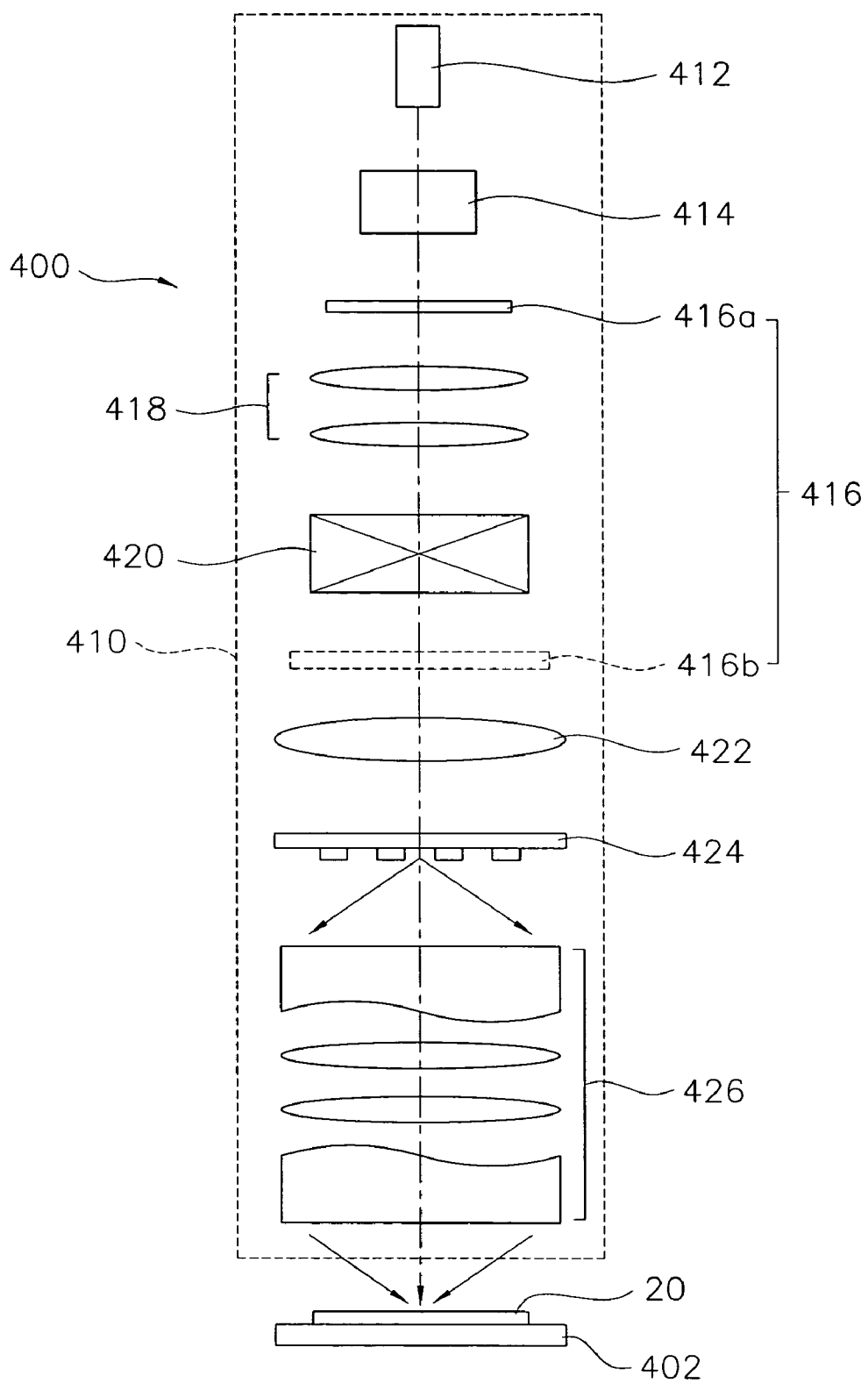
FIG. 27 is a schematic view of an optical system according to another embodiment of the present disclosure.

FIG. 27 is a schematic view of an optical system according to another embodiment of the present disclosure.

Referring to FIG. 27, an exposure apparatus 400 includes an optical system 410 for irradiating a light beam onto a photoresist layer formed on a semiconductor substrate 20, and a stage 402 for supporting and moving the semiconductor substrate 20.

The optical system 410 includes a laser 412, a beam expander 414, an optical element 416, a condenser lens unit 418, a fly's eye microlens array 420, an illumination lens 422, a photo mask 424, and a projection lens 426.

Examples of the laser 412 may include a KrF excimer laser for generating a KrF laser beam having a wavelength of 248 nm, an ArF excimer laser for generating an ArF laser beam having a wavelength of 198 nm, a $F_2$ excimer laser for generating a $F_2$ laser beam having a wavelength of 157 nm, or the like.

The beam expander 414 is used to expand a cross-sectional area of a first light beam generated from the laser 412. The optical element 416 is used to form the expanded first light beam into an off-axis illumination beam having a hexapole. Examples of the optical element 416 may include a holographic optical element (HOE) 416a, an aperture plate 416b, or the like.

When the holographic optical element 416a is used as the optical element 416, the holographic optical element 416a may be disposed between the beam expander 414 and the condenser lens unit 418. When the aperture plate 416b is used as the optical element 416, the aperture plate 416b may be disposed between the fly's eye microlens array 420 and the illumination lens 422. Alternatively, the aperture plate 416b may be disposed between the beam expander 414 and the condenser lens unit 418 or between the condenser lens unit 418 and the fly's eye microlens array 420.

Further detailed descriptions of these elements will be omitted since these elements are similar to those already described in connection with the exposure apparatus 200 shown in FIG. 7.

According to embodiments of the present disclosure, the hexapole off-axis illumination may improve the resolution of photoresist pattern including the first holes and the second holes, and the depth of focus of the light beam incident upon the photoresist layer on the semiconductor substrate. Accordingly, a process margin in a photolithography process for forming the photoresist pattern may be improved.

What is claimed is:

1. An optical system, comprising:
a light source for generating a first light beam;
an optical element for forming the first light beam into an off-axis illumination beam having a hexapole, wherein the hexapole of the off-axis illumination beam incident upon the illumination lens includes,
four first poles having a first size, and symmetrically disposed with respect to an x-axis and a y-axis, which are substantially perpendicular and intersect each other, wherein the x-axis and the y-axis are arranged on a plane that is substantially perpendicular with respect to an optical axis of the illumination lens, and
two second poles having a second size equal to or greater than the first size, and disposed in the x-axis so as to be symmetric with respect to the y-axis;
an illumination lens for directing the off-axis illumination beam onto a photo mask having a mask pattern; and
a projection lens for receiving a second light beam transmitted through the photo mask and projecting the second light beam onto a substrate so as to form a photoresist pattern corresponding to the mask pattern on the substrate,
wherein the photoresist pattern comprises a plurality of first holes arranged in rows and columns and a plurality of second holes arranged in a zigzag along a row direction and a column direction, and each second hole is arranged at a center of an imaginary rectangle limited by four first holes and has a cross-sectional area greater than those of the first holes.

2. The optical system of claim 1, wherein the x-axis is substantially parallel to the rows, and the y-axis is substantially parallel to the columns.

3. The optical system of claim 1, wherein a first distance $\sigma_1$ between each first pole and the y-axis, a second distance $\sigma_2$ between each first pole and the x-axis, and a third distance $\sigma_3$ between each second pole and the y-axis are expressed by the following equations, respectively:

$$\sigma_1 = \lambda/(2\, p_1\, NA),$$

$$\sigma_2 = \lambda/(2\, p_2\, NA), \text{ and}$$

$$\sigma_3 = \lambda/(p_1\, NA),$$

where $\lambda$ is a wavelength of the first light beam, $p_1$ is a first pitch of the first holes arranged in a row direction, $p_2$ is a second pitch of the second holes arranged in a column direction, and NA is a numerical aperture of the projection lens.

4. The optical system of claim 3, wherein the first distance $\sigma_1$, the second distance $\sigma_2$, and the third distance $\sigma_3$ have a tolerance range of about ±10%.

5. The optical system of claim 1, wherein the first poles and the second poles are provided in a form of a circle, an ellipse, a tetragon or a sector.

6. The optical system of claim 1, wherein each first pole is provided in a form of a circle or a regular tetragon, and each second pole is provided in a form of an ellipse or a right-angled tetragon extending in the y-axis direction.

7. The optical system of claim 1, wherein a ratio of the first size to the second size is from about 1:1 to about 1:5.

8. The optical system of claim 7, wherein each first pole and each second pole comprise a plurality of third poles having a third size smaller than the first size.

9. The optical system of claim 1, wherein the optical element is a holographic optical element.

10. The optical system of claim 1, wherein the optical element is an aperture plate having a plurality of openings corresponding to the hexapole.

11. An optical system, comprising:

a light source for generating a first light beam;

an optical element for forming the first light beam into an off-axis illumination beam having a hexapole, wherein the hexapole of the off-axis illumination beam incident upon the illumination lens includes, four first poles having a first intensity, and symmetrically disposed with respect to an x-axis and a y-axis, which are substantially perpendicular and intersect each other, wherein the x-axis and the y-axis are arranged on a plane that is substantially perpendicular with respect to an optical axis of the illumination lens, and two second poles having a second intensity equal to or greater than the first intensity, and disposed in the x-axis so as to be symmetric with respect to the y-axis;

an illumination lens for directing the off-axis illumination beam onto a photo mask having a mask pattern; and a projection lens for receiving a second light beam transmitted through the photo mask and projecting the second light beam onto a substrate so as to form a photoresist pattern corresponding to the mask pattern on the substrate, wherein the photoresist pattern comprises a plurality of first holes arranged in rows and columns and a plurality of second holes arranged in a zigzag along a row direction and a column direction, and each second hole is arranged at a center of an imaginary rectangle limited by four first holes and has a cross-sectional area greater than those of the first holes.

12. The optical system of claim 11, wherein a ratio of the first intensity to the second intensity is from about 1:1 to about 1:5.

13. A method for forming a photoresist pattern on a substrate, comprising:

generating a first light beam;

forming the first light beam into an off-axis illumination beam having a hexapole, wherein the hexapole of the off-axis illumination beam includes, four first poles having a first size, and symmetrically disposed with respect to an x-axis and a y-axis, which are substantially perpendicular and intersect each other, wherein the x-axis and the y-axis are arranged on a plane that is substantially perpendicular to an advancing direction of the off-axis illumination beam, and two second poles having a second size equal to or greater than the first size, and disposed in the x-axis so as to be symmetric with respect to the y-axis;

directing the off-axis illumination beam onto a photo mask having a mask pattern so as to form a second light beam transmitted through the photo mask; and projecting the second light beam onto a substrate so as to form a photoresist pattern corresponding to the mask pattern on the substrate, wherein the photoresist pattern comprises a plurality of first holes arranged in rows and columns and a plurality of second holes arranged in a zigzag along a row direction and a column direction, and each second hole is arranged at a center of an imaginary rectangle limited by four first holes and has a cross-sectional area greater than those of the first holes.

14. The method of claim 13 wherein a first distance $\sigma_1$ between each first pole and the y-axis, a second distance $\sigma_2$ between each first pole and the x-axis, and a third distance $\sigma_3$ between each second pole and the y-axis are expressed by the following equations, respectively:

$$\sigma_1 = \lambda/(2\ p_1\ NA),$$

$$\sigma_2 = \lambda/(2\ p_2\ NA), \text{ and}$$

$$\sigma_3 = \lambda/(p_1\ NA),$$

where $\lambda$ is a wavelength of the first light beam, $p_1$ is a first pitch of the first holes arranged in a row direction, $p_2$ is a second pitch of the second holes arranged in a column direction, and NA is a numerical aperture of a projection lens for projecting the second light onto the substrate.

15. The method of claim 13, wherein the first pole and the second pole are provided in a form of a circle, an ellipse, a tetragon or a sector.

16. The method of claim 13, wherein a ratio of the first size to the second size is from about 1:1 to about 1:5.

17. The method of claim 16, wherein each first pole and each second pole comprise a plurality of third poles having a third size smaller than the first size.

18. A method for forming a photoresist pattern on a substrate, comprising:

generating a first light beam;

forming the first light beam into an off-axis illumination beam having a hexapole, wherein the hexapole of the off-axis illumination beam includes, four first poles having a first intensity, and symmetrically disposed with respect to an x-axis and a y-axis, which are substantially perpendicular and intersect each other, wherein the x-axis and the y-axis are arranged on a plane that is substantially perpendicular to an advancing direction of the off-axis illumination beam, and two second poles having a second intensity equal to or greater than the first intensity, and disposed in the x-axis so as to be symmetric with respect to the y-axis;

directing the off-axis illumination beam onto a photo mask having a mask pattern so as to form a second light beam transmitted through the photo mask; and projecting the second light beam onto a substrate so as to form a photoresist pattern corresponding to the mask pattern on the substrate, wherein the photoresist pattern comprises a plurality of first holes arranged in rows and columns and a plurality of second holes arranged in a zigzag along a row direction and a column direction, and each second hole is arranged at a center of an imaginary rectangle limited by four first holes and has a cross-sectional area greater than those of the first holes.

19. The method of claim 18, wherein a ratio of the first intensity to the second intensity is from about 1:1 to about 1:5.

20. An optical system, comprising:
a light source for generating a first light beam;
an optical element for forming the first light beam into an off-axis illumination beam having a hexapole, wherein each illumination beam of the hexapole of the off-axis illumination beam is formed of a plurality of illumination beams;
an illumination lens for directing the off-axis illumination beam onto a photo mask having a mask pattern; and
a projection lens for receiving a second light beam transmitted through the photo mask and projecting the second light beam onto a substrate so as to form a photoresist pattern corresponding to the mask pattern on the substrate,
wherein the photoresist pattern comprises a plurality of first holes arranged in rows and columns and a plurality of second holes arranged in a zigzag along a row direction and a column direction, and each second hole is arranged at a center of an imaginary rectangle limited by four first holes and has a cross-sectional area greater than those of the first holes.

* * * * *